United States Patent
Yang et al.

(10) Patent No.: US 11,158,838 B2
(45) Date of Patent: Oct. 26, 2021

(54) FLEXIBLE ORGANIC-INORGANIC PASSIVATION LAYER AND METHOD OF FABRICATING THE SAME

(71) Applicant: SAMSUNG ELECTRONICS CO., LTD., Suwon-si (KR)

(72) Inventors: Wooyoung Yang, Hwaseong-si (KR); Wenxu Xianyu, Suwon-si (KR); Yongsung Kim, Suwon-si (KR); Changseung Lee, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 177 days.

(21) Appl. No.: 16/268,805

(22) Filed: Feb. 6, 2019

(65) Prior Publication Data
US 2019/0326555 A1 Oct. 24, 2019

(30) Foreign Application Priority Data
Apr. 24, 2018 (KR) .......... 10-2018-0047319

(51) Int. Cl.
    *H01L 51/52* (2006.01)
    *C23C 16/455* (2006.01)
    (Continued)

(52) U.S. Cl.
CPC .... *H01L 51/5256* (2013.01); *C23C 16/45536* (2013.01); *C23C 16/50* (2013.01); *H01L 51/107* (2013.01); *C23C 18/125* (2013.01)

(58) Field of Classification Search
CPC .............. H01L 51/5256; H01L 51/107; H01L 51/0097; C23C 16/45536; C23C 16/50; C23C 18/125; Y02E 10/549
See application file for complete search history.

(56) References Cited

U.S. PATENT DOCUMENTS

| | | |
|---|---|---|
| 7,897,521 B2 | 3/2011 | Jung et al. |
| 7,906,217 B2 | 3/2011 | Inagaki et al. |
| (Continued) | | |

FOREIGN PATENT DOCUMENTS

| | | | |
|---|---|---|---|
| JP | 5740179 B2 | 6/2015 | |
| JP | 5803822 B2 | 11/2015 | |
| (Continued) | | | |

OTHER PUBLICATIONS

Xiao, et al., "A flexible transparent gas barrier film employing the method of mixing ALD/MLD-grown $Al_2O_3$ and alucone layers", Nanoscale Research Letters, 2015, vol. 10, No. 130, 7 total pages.
(Continued)

*Primary Examiner* — Karen Kusumakar
(74) *Attorney, Agent, or Firm* — Sughrue Mion, PLLC

(57) ABSTRACT

Provided are a flexible organic-inorganic passivation film and a method of forming the same. The flexible organic-inorganic passivation film includes an organic-inorganic passivation film formed by alternately and repeatedly forming an organic film and an inorganic film on a substrate. The organic film is formed by stacking plasma-process generated material on a material layer thereunder. The plasma-process generated material is formed by plasma processing a hydrocarbon or a fluorocarbon.

13 Claims, 3 Drawing Sheets

(51) Int. Cl.
    *C23C 16/50*         (2006.01)
    *H01L 51/10*         (2006.01)
    *C23C 18/12*         (2006.01)

(56) References Cited

U.S. PATENT DOCUMENTS

| | | |
|---|---|---|
| 8,722,160 B2 | 5/2014 | Sager et al. |
| 2004/0195960 A1* | 10/2004 | Czeremuszkin ....... C08J 7/0423 <br> 313/504 |
| 2008/0096395 A1* | 4/2008 | Terasaki ............ H01L 21/02255 <br> 438/759 |
| 2013/0040102 A1 | 2/2013 | Gleason et al. |
| 2018/0294157 A1* | 10/2018 | Cheng ................... C23C 16/045 |

FOREIGN PATENT DOCUMENTS

| | | |
|---|---|---|
| JP | 2017-128803 A | 7/2017 |
| KR | 10-1235082 B1 | 2/2013 |
| KR | 10-1563341 B1 | 11/2015 |

OTHER PUBLICATIONS

Sung-Min Lee et al., "A Review of Flexible OLEDs Toward Highly Durable Unusual Displays", IEEE Transactions on Electron Devices, vol. 64, No. 5, May 2017, pp. 1922-1931, 10 pages total.

\* cited by examiner

FLEXIBLE ORGANIC-INORGANIC PASSIVATION LAYER AND METHOD OF FABRICATING THE SAME

CROSS-REFERENCE TO RELATED APPLICATION

This application claims priority from Korean Patent Application No. 10-2018-0047319, filed on Apr. 24, 2018, in the Korean Intellectual Property Office, the disclosure of which is incorporated herein in its entirety by reference.

BACKGROUND

1. Field

The present disclosure relates to flexible organic-inorganic passivation layers and methods of fabricating the flexible organic-inorganic passivation layers.

2. Description of the Related Art

Functions of electronic devices may be damaged or degraded as a result of external impacts or moisture penetration. In this regard, research is being conducted on protection layers for protecting electronic devices. Recently, electronic devices using organic light-emitting devices that use organic materials have been developed.

An organic material used in an organic light-emitting device may be easily oxidized by moisture, and thus, may be easily damaged. Therefore, there is a need to develop an encapsulation technique for preventing moisture from penetrating into organic light-emitting devices. In the case of a hard organic light-emitting device, a glass encapsulation technique in which the organic light-emitting device is covered and protected by using glass is used, and in the case of a soft organic light-emitting device, a thin film encapsulation technique in which the organic light-emitting device is protected by a thin film is used.

An organic-inorganic multi-layer thin film may be used for the thin film encapsulation technique. The organic-inorganic multi-layer thin film includes organic material layers and inorganic material layers. The organic material layers provide flexible thin film encapsulation and the inorganic material layers block penetration of moisture and oxygen into the organic-inorganic multi-layer thin film. A conventional process for forming the organic material layer may include coating a thin film of a few μm by using a spray method or an ink-jet method, and after curing the organic material layer by using ultraviolet (UV) rays, the inorganic material layer may be deposited on the organic material layer.

However, when the organic material layers and the inorganic material layers are alternatively formed to form an organic-inorganic multi-layer thin film, a dedicated equipment is required for forming the organic material layers and the inorganic material layers, respectively, and thus, throughput may be reduced.

SUMMARY

Provided are flexible organic-inorganic passivation layers formed by alternately forming organic material layers and inorganic material layers, preferably in the same chamber, and methods of fabricating the flexible organic-inorganic passivation layer.

Additional aspects will be set forth in part in the description which follows and, in part, will be apparent from the description, or may be learned by practice of the presented embodiments.

According to an aspect of an embodiment, a flexible organic-inorganic passivation film includes an organic-inorganic passivation film in which organic films and inorganic films are alternately and repeatedly formed on a substrate. The organic films are formed by a plasma process that includes stacking a plasma-process generated material formed by decomposing a hydrocarbon or a fluorocarbon on a material layer thereunder. The plasma-process generated material may be a plasma-process generated polymer film formed by plasma polymerization.

The plasma-process generated material may include a C—C bond and a C═C bond each having a dangling bond at surfaces thereof; a carbon-containing radical; a hydrogen radical; or a fluorine radical.

The hydrocarbon to be decomposed by the plasma processing may include cyclohexane or benzene, and the fluorocarbon to be decomposed by the plasma processing may include perfluoroalkane, fluoroalkene, fluoroalkyne, or a perfluoroaromatic compound.

Each organic film may have a thickness in a range of about 1 nm to about 50 nm, may have a thickness range of from 1 nm to 50 nm, or may have a thickness range of any discrete values between 1 nm and 50 nm (e.g., 3 nm to 10 nm).

According to an aspect of an embodiment, a method of forming a flexible organic-inorganic passivation film includes: forming an organic film by stacking, on a substrate, a plasma-process generated material (e.g., a polymer film) that is formed by decomposing a hydrocarbon or a fluorocarbon by plasma processing; and forming an inorganic film on the organic film, wherein the forming of the organic film and the inorganic film is repeated at least once.

The forming of the organic film and the forming of the inorganic film may be alternately performed at least five times. In other words, in one exemplary embodiment, the steps of forming the organic film and the inorganic film are alternately repeated five times.

The inorganic film may include $Al_2O_3$, $ZrO_2$, $Hf_2O$, $TiO_2$, $Si_3N_4$, $SiO_2$, SiON, or a mixture thereof.

The method may further include performing plasma processing on a surface of the inorganic film.

The plasma processing may be performed by using plasma of $O_2$, Ar, or $N_2O$.

The forming of the organic film and the forming of the inorganic film may include moving the substrate to a lower side of a corresponding gas nozzle by moving a supporter on which the substrate is arranged. In other words, the substrate is moved between the step of forming the organic film and the step of forming the inorganic film.

The forming of the organic film and the forming of the inorganic film may be consecutively performed in the same vacuum chamber.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
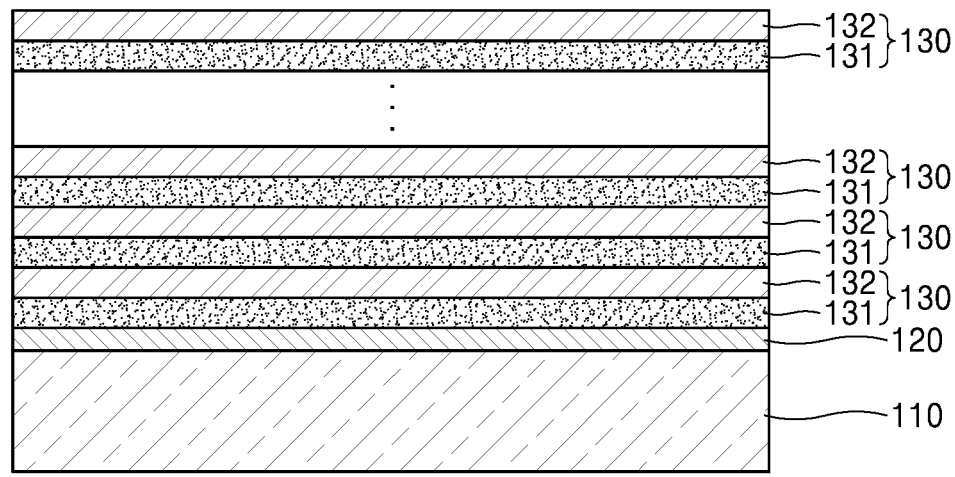
FIG. 1 is a cross-sectional view of a structure of a flexible organic-inorganic passivation layer according to an embodiment of the inventive concept.

Reference will now be made in detail to embodiments, examples of which are illustrated in the accompanying drawings. In the drawings, thicknesses of layers and regions may be exaggerated for clarity of the specification. In this regard, the present embodiments may have different forms and should not be construed as being limited to the descriptions set forth herein. The embodiments of the inventive concept are capable of various modifications and may be embodied in many different forms.

It will be understood that when an element or layer is referred to as being "on" or "above" another element or layer, the element or layer may be directly on another element or layer or intervening elements or layers.

FIG. 1 is a cross-sectional view of a structure of a flexible organic-inorganic passivation layer according to an embodiment of the inventive concept.

Referring to FIG. 1, an insulating layer 120 is formed on a substrate 110, and an organic film 131 and an inorganic film 132 are sequentially and repeatedly deposited on the insulating layer 120. The organic film 131 and the inorganic film 132 as a pair may constitute a flexible organic-inorganic passivation film 130. A plurality of flexible organic-inorganic passivation films 130 each constituting the pair may be formed on the insulating layer 120. At least five of the flexible organic-inorganic passivation films 130 may be formed on the substrate 110.

However, the present embodiment is not limited thereto. For example, the organic film 131 may be deposited directly on the substrate 110 by omitting the insulating layer 120. Also, the organic film 131 may be arranged as the uppermost layer. Also, the insulating layer 120 may be formed as the same material and by the same method as the inorganic film 132.

The substrate 110 may be flexible and may include polyethyleneterephthalate (PET), poly(methyl methacrylate (PMMA), polycarbonate (PC), or polyethylenesulfone (PES).

An electronic device (not shown), such as an organic light-emitting device or an organic transistor, may be formed on the substrate 110, and the flexible organic-inorganic passivation films 130 may be formed to cover the electronic device. The flexible organic-inorganic passivation films 130 may block the electronic device from surrounding moisture and oxygen.

The organic film 131 is a plasma-process generated material. The organic film 131 may be formed by stacking (or depositing) a product, which is generated by dissolving or decomposing a hydrocarbon or a fluorocarbon using plasma, on a material layer thereunder. The material layer may be the insulating layer 120 or the inorganic film 132 thereunder. The plasma-process generated material may include a C—C bond or C═C bond in which a dangling bond is formed, a radical containing carbon, a hydrogen radical, or a fluorine radical. The C—C bond may be formed by providing an electron from a C atom to another C atom. The dangling bond may be formed by breaking bonds between carbons and breaking a bond of hydrogen or fluorine connected to the carbon in a hydrocarbon or a fluorocarbon.

The plasma-process generated material on which the dangling bond is formed may be readily combined with a surface of, for example, the insulating layer 120 or the inorganic film 132 thereunder, and accordingly, the plasma-process generated material may be readily adhered onto the insulating layer 120 or the inorganic film 132 thereunder. Also, another plasma-process generated material may be readily adhered to side surfaces and upper surfaces of the plasma-process generated material. That is, the organic film 131 may be formed by three-dimensionally and irregularly stacking the plasma-process generated material on the insulating layer 120 or the inorganic film 132 thereonder. The organic film 131 may reduce a surface roughness of the insulating layer 120 or the inorganic film 132 thereunder, and may reduce a defect of the surface thereof, such as by filing pin holes of the insulating layer 120 or the inorganic film 132.

Examples of the hydrocarbon to be decomposed by the plasma process include cyclohexane or benzene. Examples of the fluorocarbon to be decomposed by the plasma process include perfluoroalkane, fluoroalkene, fluoroalkyne, or a perfluoroaromatic compound. The organic film 131 does not have characteristics (physical and chemical characteristics) of the hydrocarbon or the fluorocarbon prior to plasma processing, and may be formed by stacking the plasma-process generated material having the dangling bond.

Each organic film 131 may have a thickness in a range of about 1 nm to about 50 nm. If the thickness of the organic film 131 is less than 1 nm, it is difficult to form continuous films of the organic film 131 and the flexibility of the organic film 131 is reduced. If the thickness of the organic film 131 is greater than 50 nm, fabrication time increases, and thus, throughput is reduced. Each organic film 131 may be formed by using a plasma enhanced chemical vapor deposition (PECVD) process.

The inorganic film 132 may include $Al_2O_3$, $ZrO_2$, $Hf_2O$, $TiO_2$, $Si_3N_4$, $SiO_2$, SiON, or a mixture thereof. The inorganic film 132 is mainly used as a blocking film for blocking surrounding moisture, oxygen, etc. and is formed to be thin to have flexibility. For example, each inorganic film 132 may have a thickness in a range of about 1 nm to about 50 nm, may have a thickness range of from 1 nm to 50 nm, or may have a thickness in a range of any discrete values between 1 nm and 50 nm (e.g., 3 nm to 10 nm). The inorganic film 132 may be formed by using an atomic layer deposition (ALD) method, such as a plasma-enhanced ALD process, or by using a PECVD process.

The flexible organic-inorganic passivation film 130 may be repeatedly formed by using the organic film 131 and the inorganic film 132 as a pair. The flexible organic-inorganic passivation film 130 may include more than five pairs of the organic film 131 and the inorganic film 132.

In an embodiment, the inorganic film 132 is formed on the organic film 131 in a pair of the organic film 131 and the inorganic film 132 of the flexible organic-inorganic passivation film 130, but the present embodiment is not limited thereto. For example, the organic film 131 may be formed on the inorganic film 132 in the flexible organic-inorganic passivation film 130 including the pair of the organic film 131 and the inorganic film 132.

The flexible organic-inorganic passivation film 130 according to the embodiment may be formed in a single chamber, which will be described below in detail.

Figure 2:
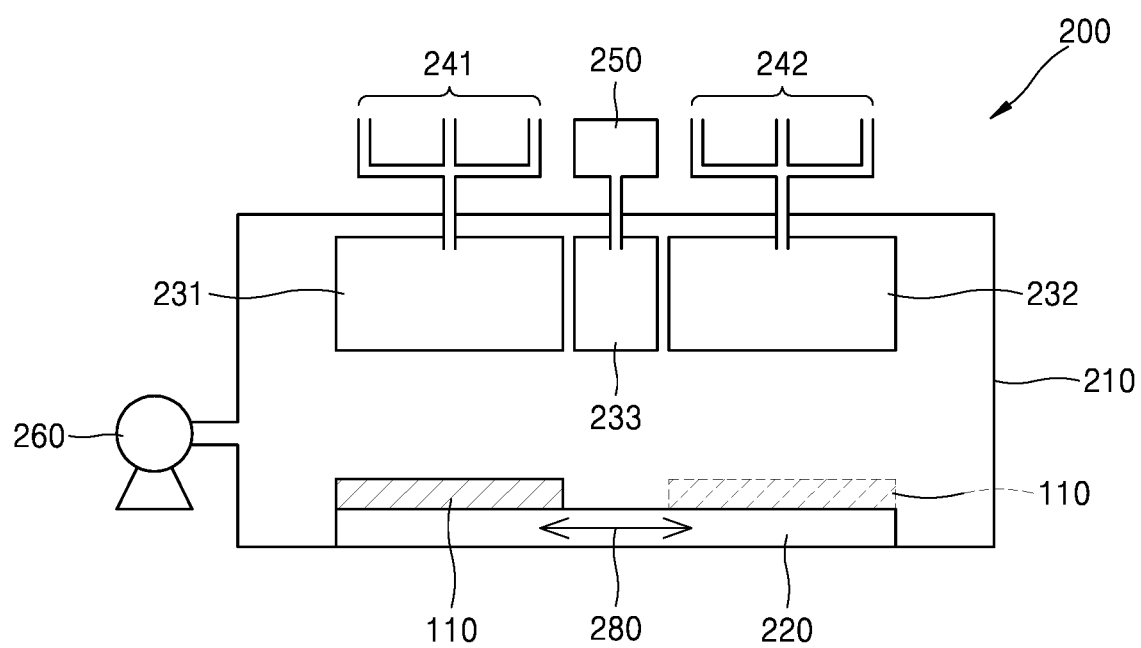
FIG. 2 is a schematic diagram of an apparatus for forming a flexible organic-inorganic passivation layer, according to an embodiment of the inventive concept.

FIG. 2 is a schematic diagram of an apparatus 200 for forming the flexible organic-inorganic passivation layer 130 according to an embodiment of the inventive concept.

Referring to FIG. 2, the flexible organic-inorganic passivation film (refer to 130 in FIG. 1) may be formed in a vacuum chamber 210. A supporter 220 that supports the substrate 110 may be arranged in the vacuum chamber 210. A means for moving a substrate 280 back-and-forth in a straight line may be installed on the supporter 220, but the present embodiment is not limited thereto. For example, a means for rotating a substrate may be installed on the supporter 220.

The apparatus 200 for forming the flexible organic-inorganic passivation film 130 may include a means for controlling temperature in the vacuum chamber 210. For example, the apparatus 200 may include a heating wire (not shown). The heating wire may be arranged on the supporter 220 or inside the vacuum chamber 210. A temperature in the vacuum chamber 210 may be controlled by controlling a voltage applied to the heating wire.

An organic material nozzle 231, an inorganic material nozzle 232, and a plasma nozzle 233 may be installed on an upper part of the vacuum chamber 210. A plurality of fluid supply tubes 241 are connected to the organic material nozzle 231. For example, source gas supply tubes may be connected to the organic material nozzle 231. A plurality of fluid supply tubes 242 are connected to the inorganic material nozzle 232. For example, a precursor supply tube, a reactive gas supply tube, and a purge gas supply tube may be connected to the inorganic material nozzle 232. The precursor supply tube may include a plurality of precursor supply tubes. A plasma generator 250 is connected to the plasma nozzle 233.

A vacuum pump 260 may be connected to the vacuum chamber 210. A pressure in the vacuum chamber 210 may be controlled by the operation of the vacuum pump 260.

A gas supply inlet (not shown in FIG. 2) for plasma processing a surface of the inorganic film 132 may be connected to the plasma nozzle 233. For example, the gas supply inlet may be an Ar, oxygen, or $NO_2$ gas supply inlet, and a plasma is formed from these gases to process the surface of the inorganic film 132.

Also, an exhaust gas pump (not shown) for discharging gases in the vacuum chamber 210 to the outside may further be connected to the vacuum chamber 210.

Hereinafter, a method of depositing the flexible organic-inorganic passivation film 130 according to an embodiment by using the apparatus 200 of FIG. 2 will be described.

Figure 3:
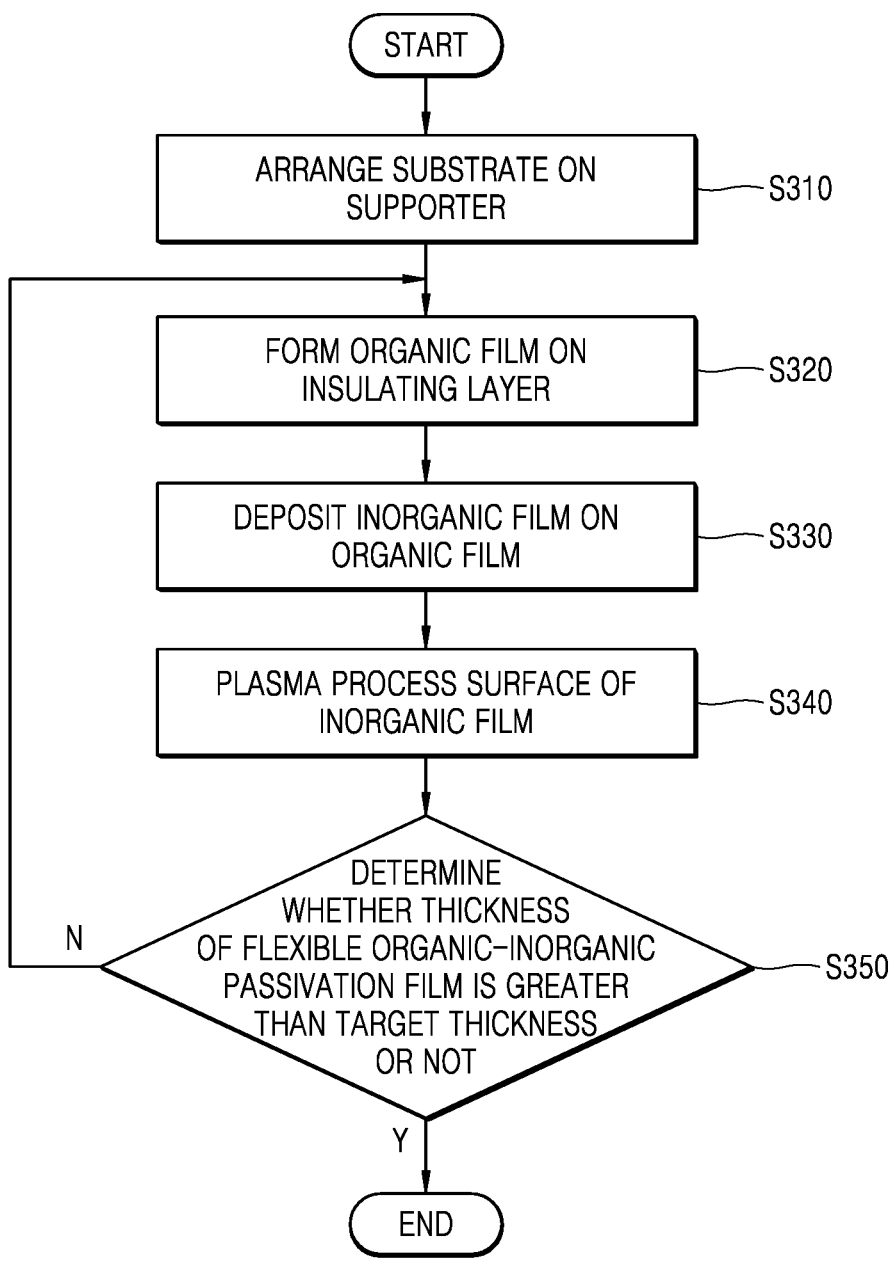
FIG. 3 is a flowchart of a method of forming a flexible organic-inorganic passivation layer, according to an embodiment of the inventive concept.

FIG. 3 is a flowchart of a method of forming a flexible organic-inorganic passivation layer 130 according to an embodiment of the inventive concept. Hereinafter, a method of forming the flexible organic-inorganic passivation film 130 will be described with reference to FIGS. 1 through 3.

First, the substrate 110 is arranged on the supporter 220 in the vacuum chamber 210 (S310). The insulating layer 120 may be formed on the substrate 110 in advance.

The organic film 131 is formed on the insulating layer 120 (S320). The substrate 110 may be moved under the organic material nozzle 231 by using the means for moving the substrate 280 back-and-forth in a straight line to form the organic film 131.

The organic film 131 may be formed by using a PECVD process. A hydrocarbon or fluorocarbon material is supplied to the organic material nozzle 231 through the source gas supply tube to form the organic film 131. For example, hydrocarbon or fluorocarbon is supplied to the source gas supply tube together with an Ar carrier gas. The amount of the source gas may be controlled according to flowrate and flow velocity of the carrier gas. For example, the Ar carrier gas may be supplied at a flowrate of 50 sccm. The hydrocarbon may include cyclohexane or benzene. The fluorocarbon may be perfluoroalkane, fluoroalkene, fluoroalkyne, or a perfluoroaromatic compound.

When a power in a range of about 20 W to about 30 W is applied to the plasma generator 250, plasma is generated from the plasma generator 250 and the plasma is supplied to the plasma nozzle 233.

The hydrocarbon or fluorocarbon materials supplied to the vacuum chamber 210 may be decomposed to plasma-process generated material by the plasma supplied from the plasma nozzle 233, and accordingly, a C—C bond or a C=C bond, in which a dangling bond is formed, a carbon-containing radical, a hydrogen radical, or a fluorine radical may be included by breaking bonds of the hydrocarbon or fluorocarbon material. The dangling bond may be formed by breaking bonds between carbons or bonds between hydrogen or fluorine connected to carbons in the hydrocarbon or fluorocarbon material.

The plasma-process generated material including the dangling bond may readily combine with other materials. For example, the plasma-process generated material including the dangling bond may readily combine with a surface of the inorganic film 132, and accordingly, the plasma-process generated material may be readily adhere onto the inorganic film 132. Also, other plasma-process generated material may be readily adhered to side surfaces and upper surfaces of the plasma-process generated material. That is, the organic film 131 may be formed by 3-dimensionally and irregularly stacking the plasma-process generated material onto the inorganic film 132. The organic film 131 may reduce a surface roughness of the inorganic film 132, and may fill a defect, such as pin holes of the inorganic film 132 thereunder.

A thickness of the organic film 131 may be controlled by controlling a source gas supply time. The organic film 131 may be formed at a few nm thickness per minute, for example, at a rate of about 2 nm thickness per minute.

The organic film 131 may have a structure different from that of the source material thereof. That is, if a source gas supplied to form the organic film 131 is cyclohexane, the organic film 131 may have a structure in which carbons having dangling bonds and hydrogens are simply adhered to each other, and thus, the organic film 131 may have different characteristics from the cyclohexane. The organic film 131 may have a thickness in a range of about 1 nm to about 50 nm.

When the inorganic film 132 is formed in advance on the substrate 110, the substrate 110 is arranged directly below the inorganic material nozzle 232. At this point, the means for moving the substrate 280 back-and-forth in a straight line may be used. The substrate 110 indicated by dotted lines in FIG. 2 is depicted as the substrate 110 moved under the inorganic material nozzle 232.

Next, the inorganic film 132 is deposited on the organic film 131 (S330). The substrate 110 may be moved under the inorganic material nozzle 232 by using the means for moving the substrate 280 back-and-forth in a straight line to form the inorganic film 132.

The inorganic film 132 may be deposited by using an ALD process. The inorganic film 132 may include $Al_2O_3$, $ZrO_2$, $Hf_2O$, $TiO_2$, $Si_3N_4$, $SiO_2$, or SiON. For example, when $Al_2O_3$ is used for forming the inorganic film 132, a trimethylaluminium, (TMA) precursor may be supplied to the inorganic material nozzle 232 through the precursor supply tube (not shown). Next, the TMA is purged. For example, the purge may be performed by supplying a nitrogen gas to the inorganic material nozzle 232 through a purge gas supply tube, but the present embodiment is not limited thereto. The purge gas supply tube may be separately installed from the inorganic material nozzle 232.

Precursors that are not adhered to the organic film 131 are separated from precursors adhered to the substrate 110 and the separated precursors are discharged to the outside through the exhaust gas pump. Next, an alumina layer is formed by causing a reaction between water and TMA by supplying water into the vacuum chamber 210 through a reactive gas supply tube. Next, residual steam on the organic film 131 is purged. The alumina layer having a thickness of approximately 1 Å may be formed through 1 cycle. The inorganic film 132 having a predetermined thickness, for example, in a range of about 1 nm to about 50 nm may be formed by repeating the alumina layer forming process. The thickness of the inorganic film 132 may be controlled by controlling the number of repeating the cycles.

When the inorganic film 132 includes $Si_3N_4$, silane which is a silicon precursor and ammonia or nitrogen gas which is a nitrogen precursor may be respectively supplied to the vacuum chamber 210 through different source gas supply tubes, or the silane and ammonia or nitrogen gas may be sequentially supplied through a single source gas supply tube.

The inorganic film 132 described above may be formed by using an ALD process, but the present embodiment is not limited thereto. For example, the inorganic film 132 may be formed by using a PECVD process.

Next, a surface of the inorganic film 132 is plasma processed (S340). After forming the inorganic film 132, plasma is supplied through the plasma nozzle 233. At this point, an oxygen gas, an argon gas, or a $N_2O$ gas may be supplied through the inorganic material nozzle 232. The plasma supplied together with the oxygen gas, the argon gas, or the $N_2O$ gas makes the oxygen gas, the argon gas, or the $N_2O$ gas into plasma ions, and the plasma ions may reduce a surface roughness of the surface of the inorganic film 132 by reacting with the surface of the inorganic film 132. Also, the plasma processing may remove pin holes in the inorganic film 132.

The plasma processing process (S340) may be omitted. As a result, the flexible organic-inorganic passivation film 130 may be formed.

Next, it is determined whether the thickness of the flexible organic-inorganic passivation film 130 is equal to or greater than a target thickness or not (S350). In the S350, if it is determined that the thickness of the flexible organic-inorganic passivation film 130 is less than the target thickness, the process S320 through the process S340 are repeated.

In S350, if it is determined that the thickness of the flexible organic-inorganic passivation film 130 is equal to or greater than the target thickness, the process of forming the flexible organic-inorganic passivation film 130 is terminated.

The inorganic film 132 may be further formed between the substrate 110 and the flexible organic-inorganic passivation film 130. Also, another organic film 131 may further be formed on the inorganic film 132 of the uppermost flexible organic-inorganic passivation film 130.

Figure 4:
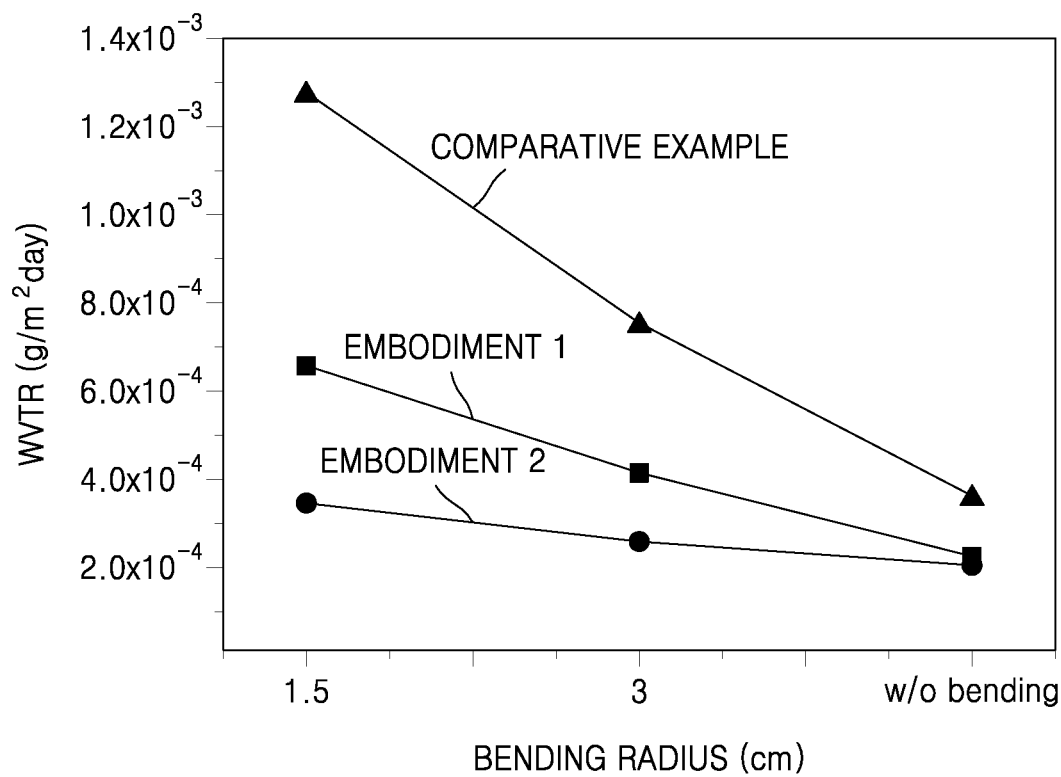
FIG. 4 is a graph showing a water-vapor transmission rate (WVTR) of a flexible organic-inorganic passivation layer, according to an embodiment of the inventive concept.

FIG. 4 is a graph showing a water-vapor transmission rate (WVTR) of a flexible organic-inorganic passivation layer 130 according to an embodiment of the inventive concept.

In Embodiment 1, a flexible organic-inorganic passivation film having a structure in which an alumina inorganic film with a thickness of 12.5 nm/an organic film with a thickness of 30 nm/an alumina inorganic film with a thickness of 12.5 nm was formed on a PET substrate having a thickness of 0.5 mm.

In Embodiment 2, a flexible organic-inorganic passivation film having a structure in which an alumina inorganic film with a thickness of 8.3 nm/an organic film with a thickness of 15 nm/an alumina inorganic film with a thickness of 8.3 nm/an organic film with a thickness of 15 nm/an alumina inorganic film with a thickness of 8.3 nm was formed on a PET substrate having a thickness of 0.5 mm. In Embodiments 1 and 2, the organic film was formed by plasma processing cyclohexane.

In Comparative example, a passivation film having a thickness of 40 nm was formed by coating and curing a mixture of alumina/organic material on a PET substrate having a thickness of 0.5 mm.

Referring to FIG. 4, when compared to an organic-inorganic passivation film in which an inorganic material and an organic material that are simply mixed are used, it is seen that WVTR characteristics of the flexible organic-inorganic passivation films according to the Embodiments 1 and 2 are improved. In particular, when measuring the WVTR characteristics after bending the flexible organic-inorganic passivation film with a bar having a radius of 1.5 cm, it can be seen the WVTR characteristics of the Embodiments 1 and 2 are further remarkably improved than the Comparative example.

The flexible organic-inorganic passivation film formed according to the embodiment has a low WVTR while having a small thickness.

Also, an organic film and an inorganic film are formed may be formed a single vacuum chamber, and thus, a process time is reduced and a throughput is increased.

While one or more embodiments have been described with reference to the figures, it will be understood by those of ordinary skill in the art that various changes in form and details may be made therein without departing from the spirit and scope as defined by the following claims.

What is claimed is:

1. A method of forming a flexible organic-inorganic passivation film, the method comprising:
    forming an organic film by stacking, on a substrate, a plasma-process generated material formed by decomposing a hydrocarbon or a fluorocarbon by first plasma processing;
    forming an inorganic film on the organic film; and
    after forming the inorganic film, performing second plasma processing on a surface of the inorganic film to reduce a surface roughness and a defect of the inorganic film,
    wherein the forming of the organic film and the inorganic film is repeated at least once,
    wherein the forming of the organic film and the forming of the inorganic film are performed in a singled vacuum chamber,
    the vacuum chamber comprises a plasma nozzle, an organic material nozzle, and an inorganic material nozzle; and
    the substrate is moved between the forming of the organic film and the forming of the inorganic film by moving a support on which the substrate is arranged.

2. The method of claim 1, wherein the plasma-process generated material comprises a C—C bond and a C=C bond each having a dangling bond at surfaces thereof, a carbon-containing radical, a hydrogen radical, or a fluorine radical.

3. The method of claim 1, wherein the forming of the organic film and the forming of the inorganic film are alternately performed at least five times.

4. The method of claim 1, wherein the organic film has a thickness in a range of about 1 nm to about 50 nm.

5. The method of claim 1, wherein the inorganic film comprises $Al_2O_3$, $ZrO_2$, $Hf_2O$, $TiO_2$, $Si_3N_4$, $SiO_2$, SiON, or a mixture thereof.

6. The method of claim 1, wherein the hydrocarbon comprises cyclohexane or benzene, and the fluorocarbon comprises perfluoroalkane, fluoroalkene, fluoroalkyne, or a perfluoroaromatic compound.

7. The method of claim 1, wherein the plasma processing is performed by using plasma of $O_2$, Ar, or $N_2O$.

8. The method of claim 1, wherein the forming of the organic film and the forming of the inorganic film comprise moving the substrate to a lower side of a corresponding one of the plasma nozzle, the organic material nozzle, or the inorganic material nozzle.

9. The method of claim 1, wherein the forming of the organic film and the forming of the inorganic film are consecutively performed in the single vacuum chamber.

10. The method of claim 1, wherein the second plasma processing comprises supplying plasma through the plasma nozzle, and supplying an oxygen gas, an argon gas, or a $N_2O$ gas through the inorganic material nozzle.

11. The method of claim 1, wherein the substrate is moved horizontally in a straight line between the forming of the organic film and the forming of the inorganic film.

12. The method of claim 1, wherein the substrate is moved between the forming of the organic film and the forming of the inorganic film by rotating the support on which the substrate is arranged.

13. The method of claim 1, wherein the defect of the inorganic film includes pin holes in the inorganic film.

* * * * *